United States Patent
Funahashi

(10) Patent No.: US 10,447,233 B2
(45) Date of Patent: Oct. 15, 2019

(54) ELASTIC WAVE DEVICE

(71) Applicant: Murata Manufacturing Co., Ltd., Nagaokakyo-shi, Kyoto-fu (JP)

(72) Inventor: Kentaro Funahashi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/225,383

(22) Filed: Dec. 19, 2018

(65) Prior Publication Data

US 2019/0123718 A1   Apr. 25, 2019

Related U.S. Application Data

(63) Continuation of application No. PCT/JP2017/022784, filed on Jun. 21, 2017.

(30) Foreign Application Priority Data

Jun. 21, 2016 (JP) ................. 2016-122478

(51) Int. Cl.
| | |
|---|---|
| H03H 9/02 | (2006.01) |
| H03H 9/05 | (2006.01) |
| H03H 9/145 | (2006.01) |
| H03H 9/25 | (2006.01) |
| H03H 9/54 | (2006.01) |

(52) U.S. Cl.
CPC ...... *H03H 9/02992* (2013.01); *H03H 9/0514* (2013.01); *H03H 9/14538* (2013.01); *H03H 9/25* (2013.01); *H03H 9/545* (2013.01)

(58) Field of Classification Search
CPC .. H03H 9/02992; H03H 9/0514; H03H 9/545; H03H 9/14538; H03H 9/25

USPC ......... 333/133, 187, 188, 193–196; 310/365, 310/366

See application file for complete search history.

(56) References Cited

U.S. PATENT DOCUMENTS

| | | | |
|---|---|---|---|
| 5,864,260 A | 1/1999 | Lee | |
| 6,766,149 B1 | 7/2004 | Hikita et al. | |
| 9,484,887 B2 * | 11/2016 | Jian | H03H 9/0542 |
| 9,520,859 B2 * | 12/2016 | Inate | H03H 9/02913 |
| 2013/0335171 A1 * | 12/2013 | Yamato | H03H 9/059 |
| | | | 333/193 |
| 2014/0340168 A1 | 11/2014 | Kawachi et al. | |

FOREIGN PATENT DOCUMENTS

| | | |
|---|---|---|
| JP | 9-307399 A | 11/1997 |
| JP | 2000-188522 A | 7/2000 |
| JP | 2010-245722 A | 10/2010 |
| WO | 2013/118240 A1 | 8/2013 |

OTHER PUBLICATIONS

Official Communication issued in International Patent Application No. PCT/JP2017/022784, dated Aug. 29, 2017.

* cited by examiner

*Primary Examiner* — Robert J Pascal
*Assistant Examiner* — Jorge L Salazar, Jr.
(74) *Attorney, Agent, or Firm* — Keating & Bennett, LLP

(57) ABSTRACT

An elastic wave device includes a piezoelectric substrate, filter electrodes, input terminal electrodes, output terminal electrodes, and ground terminal electrodes. The filter electrodes are disposed along a first direction. The ground terminal electrodes corresponding to the filter electrodes are respectively disposed between adjacent filter electrodes, and are common to the adjacent filter electrodes.

12 Claims, 5 Drawing Sheets

ELASTIC WAVE DEVICE

CROSS REFERENCE TO RELATED APPLICATIONS

This application claims the benefit of priority to Japanese Patent Application No. 2016-122478 filed on Jun. 21, 2016 and is a Continuation Application of PCT Application No. PCT/JP2017/022784 filed on Jun. 21, 2017. The entire contents of each application are hereby incorporated herein by reference.

BACKGROUND OF THE INVENTION

1. Field of the Invention

The present invention relates to an elastic wave device including a substrate on which a plurality of elastic wave filters are provided.

2. Description of the Related Art

Hitherto, various types of elastic wave filters have been put to practical use. Many elastic wave filters are used in wireless terminals. For example, a wireless terminal described in Japanese Unexamined Patent Application Publication No. 2000-188522 includes a duplexer or a triplexer including a plurality of elastic wave filters.

At present, wireless terminals are demanded to cope with multi-bands and size reduction. In this case, while the wireless terminals are provided with an increasing number of filters, the wireless terminals need to be reduced in size. Therefore, it has been required to reduce the size of elastic wave devices.

To reduce the size of an elastic wave device, a configuration in which resonator electrodes respectively corresponding to a plurality of elastic wave filters are formed on one piezoelectric substrate has been conceived.

However, desired characteristics of each elastic wave filter may not be achieved simply by forming a plurality of resonator electrodes (IDT electrodes, etc.) on one piezoelectric substrate. Specifically, desired filter characteristics are difficult to achieve unless the grounding state of each elastic wave filter is satisfactory.

At the same time, if a ground connection terminal (electrode pad) for grounding is individually provided for each of a plurality of elastic wave filters, the space on the piezoelectric substrate for providing ground connection terminals is necessary at least for the number of elastic wave filters. It is, thus, not easy to reduce the size of an elastic wave device.

SUMMARY OF THE INVENTION

Preferred embodiments of the present invention provide small elastic wave devices each including a plurality of elastic wave filters having good filter characteristics.

An elastic wave device according to a preferred embodiment of the present invention includes a piezoelectric substrate and an electrode pattern that define elastic wave filters provided on a surface of the piezoelectric substrate. The electrode pattern includes n filter electrodes, where n is an integer that satisfies n≥3, a first terminal electrode, a second terminal electrode, and a ground terminal electrode corresponding to each of the n filter electrodes.

The n filter electrodes are respectively provided on the surface of the piezoelectric substrate and are arranged along a first direction. The first terminal electrode and the second terminal electrode are respectively provided on the surface of the piezoelectric substrate, and correspond to each of the n filter electrodes. The ground terminal electrode is respectively provided on the surface of the piezoelectric substrate, and corresponds to each of the n filter electrodes.

The n filter electrodes include a first filter electrode at a first end of the piezoelectric substrate in the first direction, a second filter electrode at a second end of the piezoelectric substrate in the first direction, and a third filter electrode different from the first and second filter electrodes.

A ground terminal electrode corresponding to the third filter electrode is disposed between the third filter electrode and a filter electrode of the n filter electrodes adjacent to the third filter electrode. No other filter electrode is disposed between the first filter electrode and a ground terminal electrode connected thereto, between the second filter electrode and a ground terminal electrode connected thereto, and between the third filter electrode and a ground terminal electrode connected thereto.

In this configuration, the number of ground terminal electrodes is less than the number of filter electrodes, and a ground terminal electrode is provided for every filter electrode without another filter electrode interposed therebetween.

In addition, it is preferable that an elastic wave device according to a preferred embodiment of the present invention has the following configuration. The first terminal electrode corresponding to the third filter electrode is provided on the first end side of the third filter electrode. The second terminal electrode corresponding to the third filter electrode is provided on the second end side of the third filter electrode. The first terminal electrode and the second terminal electrode corresponding to the third filter electrode are disposed on opposite sides with respect to the third filter electrode in a second direction orthogonal or substantially orthogonal to the first direction. The ground terminal electrode corresponding to the third filter electrode is disposed at one of the following positions (1) and (2). (1) The ground terminal electrode corresponding to the third filter electrode is disposed at the same or substantially the same position as the second terminal electrode of the third filter electrode in the first direction, and the same or substantially the same position as the first terminal electrode corresponding to the third filter electrode in the second direction. (2) The ground terminal electrode corresponding to the third filter electrode is disposed at the same or substantially the same position as the first terminal electrode corresponding to the third filter electrode in the first direction, and the same or substantially the same position as the second terminal electrode corresponding to the third filter electrode in the second direction.

In this configuration, the first terminal electrode or the second terminal electrode at the first end in the first direction is at the same or substantially the same position as the ground terminal electrode, and the dimension in the first direction of the piezoelectric substrate is smaller than in the case of disposing the electrodes at different positions.

In addition, it is preferable that an elastic wave device according to a preferred embodiment of the present invention has the following configuration. The first terminal electrode and the second terminal electrode corresponding to the first filter electrode are disposed along a second direction orthogonal or substantially orthogonal to the first direction between the first end of the piezoelectric substrate and the first filter electrode. The first terminal electrode and the second terminal electrode corresponding to the second filter electrode are disposed along the second direction between the second end of the piezoelectric substrate and the second filter electrode. A ground terminal electrode corresponding to the first filter electrode and a ground terminal electrode at the first end the second filter electrode are electrodes common to the ground terminal electrode corresponding to the third filter electrode adjacent respectively thereto.

In this configuration, the first terminal electrode, the second terminal electrode, and the ground terminal electrode corresponding to filter electrodes at two ends in the first direction among the n filter electrodes are disposed at appropriate positions for size reduction and improvement of filter characteristics.

In addition, it is preferable that an elastic wave device according to a preferred embodiment of the present invention includes a first auxiliary ground terminal electrode between the first filter electrode and the first end of the piezoelectric substrate.

In this configuration, grounding of a filter electrode close to the first end is further improved.

In addition, it is preferable that an elastic wave device according to a preferred embodiment of the present invention includes a second auxiliary ground terminal electrode between the second filter electrode and the second end of the piezoelectric substrate.

In this configuration, grounding of a filter electrode close to the second end is further improved.

According to preferred embodiments of the present invention, good filter characteristics of each of a plurality of elastic wave filters are able to be achieved, and elastic wave devices are able to be reduced in size.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Elastic wave devices according to preferred embodiments of the present invention will be described below with reference to the accompanying drawings.

Figure 1:
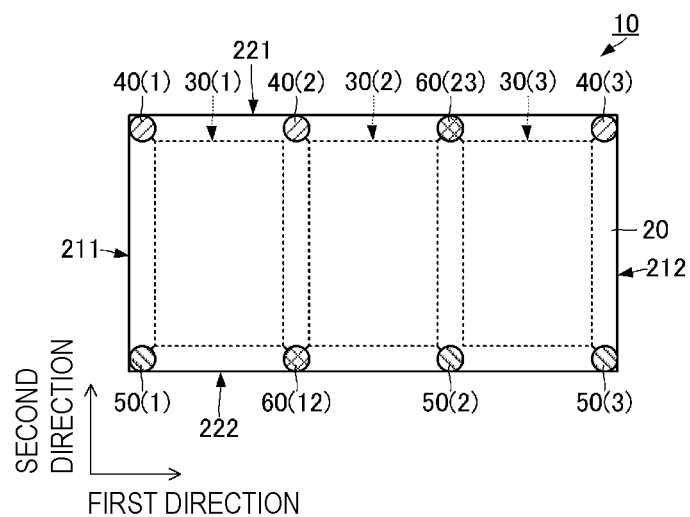
FIG. 1 is a plan view schematically illustrating the configuration of an elastic wave device according to a first preferred embodiment of the present invention.
Figure 2:
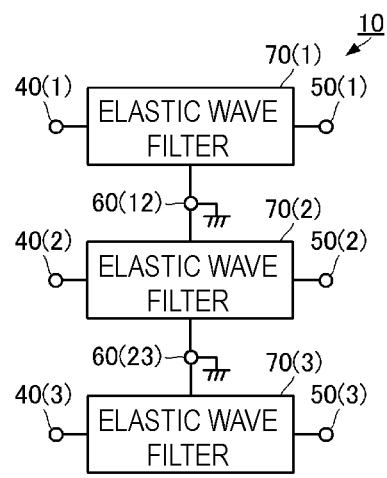
FIG. 2 is an equivalent circuit diagram of the elastic wave device according to the first preferred embodiment of the present invention.

An elastic wave device according to a first preferred embodiment of the present invention will be described with reference to the drawings. FIG. 1 is a plan view schematically illustrating the configuration of the elastic wave device according to the first preferred embodiment of the present invention. FIG. 2 is an equivalent circuit diagram of the elastic wave device according to the first preferred embodiment of the present invention.

As illustrated in FIG. 1, an elastic wave device 10 includes a piezoelectric substrate 20, a plurality of filter electrodes 30(1), 30(2), and 30(3), a plurality of input terminal electrodes 40(1), 40(2), and 40(3), a plurality of output terminal electrodes 50(1), 50(2), and 50(3), and a plurality of ground terminal electrodes 60(12) and 60(23).

The piezoelectric substrate 20 is preferably made of a material with piezoelectricity, such as lithium niobate (LN), lithium tantalate (LT), or crystal, for example.

The plurality of filter electrodes 30(1), 30(2), and 30(3), the plurality of input terminal electrodes 40(1), 40(2), and 40(3), the plurality of output terminal electrodes 50(1), 50(2), and 50(3), and the plurality of ground terminal electrodes 60(12) and 60(23) are patterns respectively provided on the surface of the piezoelectric substrate 20. These electrodes are preferably made of a highly processable and highly conductive material. For example, any of Pt, Au, Cu, Ag, and W may be used for these electrodes. Furthermore, a structure in which highly conductive metal, such as Al, for example, is laminated on the surface of any of the foregoing metals may be used for these electrodes.

Figure 8:
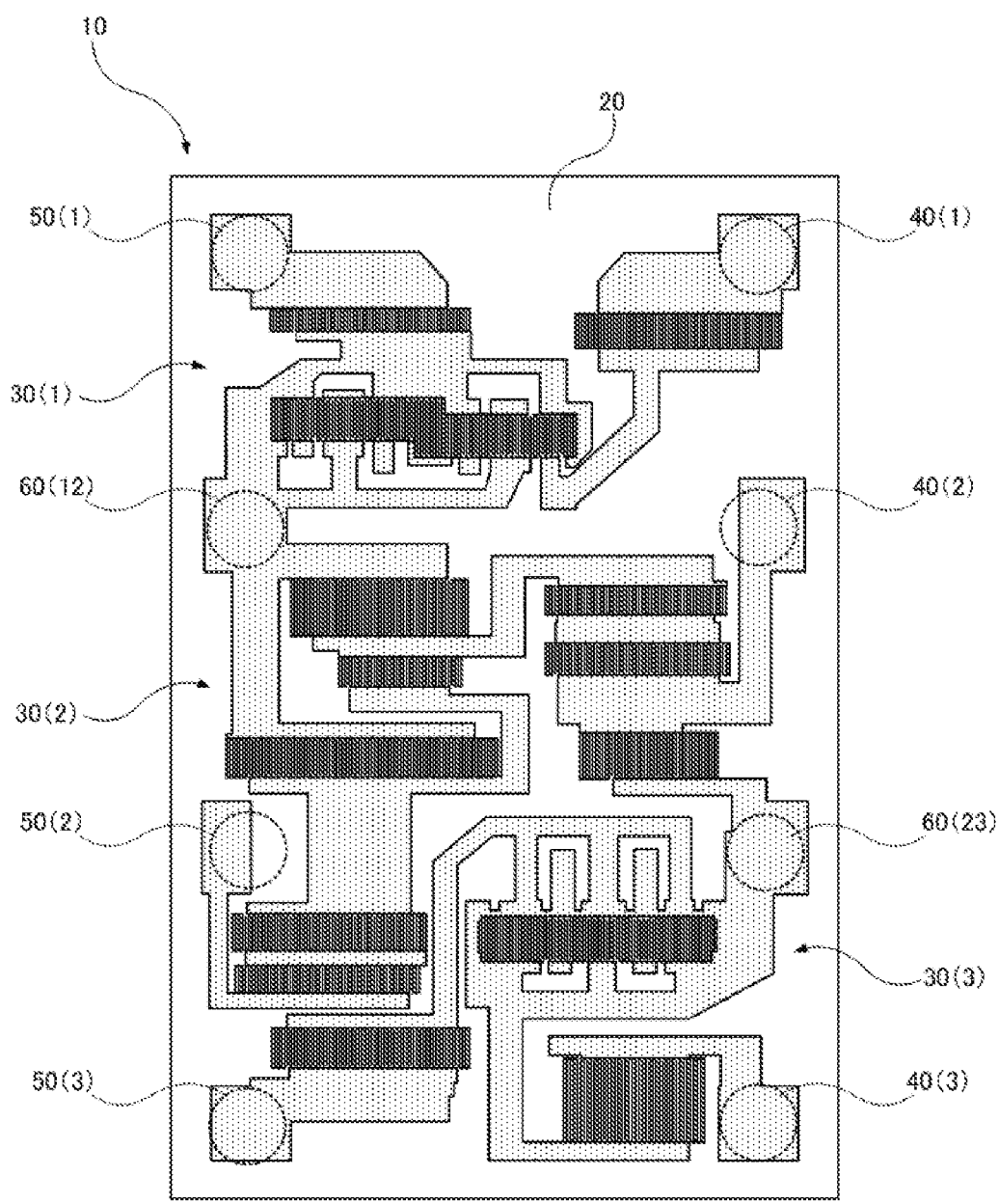
FIG. 8 is a bottom plan view schematically illustrating the configuration of an elastic wave device according to an example of a preferred embodiment of the present invention.

The plurality of filter electrodes 30(1), 30(2), and 30(3) each preferably include at least one resonator electrode, such as IDT electrode, and includes, as needed, a reflector electrode or other suitable electrodes. Although the plurality of filter electrodes 30(1), 30(2), and 30(3) have the same or similar basic structures, filter characteristics including a passband and an attenuation band are individually set for the plurality of filter electrodes 30(1), 30(2), and 30(3). The plurality of filter electrodes 30(1), 30(2), and 30(3) have different filter characteristics. In other words, the plurality of filter electrodes 30(1), 30(2), and 30(3) have different shapes in accordance with their filter characteristics. FIG. 8 is a bottom plan view of the elastic wave device 10 showing an example of an arrangement of the filter electrodes 30(1), 30(2), and 30(3) included in the elastic wave device 10.

The plurality of filter electrodes 30(1), 30(2), and 30(3) are disposed along a first direction of the piezoelectric substrate 20. The plurality of filter electrodes 30(1), 30(2), and 30(3) are disposed in the order of the filter electrode 30(1), the filter electrode 30(2), and the filter electrode 30(3) from a first end 211 to a second end 212 in the first direction of the piezoelectric substrate 20. The filter electrode 30(1) corresponds to a "filter electrode at a first end in a first direction"; the filter electrode 30(3) corresponds to a "filter electrode at a second end in the first direction"; and the filter electrode 30(2) corresponds to a "third filter electrode".

In the first direction of the piezoelectric substrate 20, the first end 211 and the filter electrode 30(1), the filter electrode 30(1) and the filter electrode 30(2), and the filter electrode 30(3) and the second end 212 are spaced apart.

In a second direction (direction orthogonal or substantially orthogonal to the first direction) of the piezoelectric substrate 20, a first end 221 (one end in the second direction of the present invention) and the plurality of filter electrodes 30(1), 30(2), and 30(3), and the plurality of filter electrodes 30(1), 30(2), and 30(3) and a second end 222 are spaced apart from one another.

The plurality of input terminal electrodes 40(1), 40(2), and 40(3) correspond to a "first terminal electrode", and the plurality of output terminal electrodes 50(1), 50(2), and 50(3) correspond to a "second terminal electrode". The plurality of input terminal electrodes 40(1), 40(2), and 40(3) and the plurality of output terminal electrodes 50(1), 50(2), and 50(3) are preferably pad-shaped electrodes, for example. Although these electrodes are illustrated as circular when viewed in plan in FIG. 1, they may be rectangular, polygonal, or other suitable shapes.

The input terminal electrode 40(1) is disposed between the first end 211 and the filter electrode 30(1) in the first direction of the piezoelectric substrate 20. The input terminal electrode 40(1) is disposed between the first end 221 and the filter electrode 30(1) in the second direction of the piezoelectric substrate 20. A portion of the input terminal electrode 40(1) may overlap an area in which the filter electrode 30(1) is provided in the first direction or the second direction. The input terminal electrode 40(1) corresponds to a "first terminal electrode for the filter electrode at the first end".

The input terminal electrode 40(1) is connected to the filter electrode 30(1) by a wiring electrode provided on the surface of the piezoelectric substrate 20. It is preferable that the wiring electrode be as short as possible.

The input terminal electrode 40(2) is disposed between the filter electrode 30(1) and the filter electrode 30(2) in the first direction of the piezoelectric substrate 20. The input terminal electrode 40(2) is disposed among the first end 221, the filter electrode 30(1), and the filter electrode 30(2) in the second direction of the piezoelectric substrate 20. A portion of the input terminal electrode 40(2) may overlap areas in which the filter electrode 30(1) and the filter electrode 30(2) are provided in the first direction or the second direction. The input terminal electrode 40(2) corresponds to a "first terminal electrode for the third filter electrode".

The input terminal electrode 40(2) is connected to the filter electrode 30(2) by a wiring electrode provided on the surface of the piezoelectric substrate 20. It is preferable that the wiring electrode be as short as possible.

The input terminal electrode 40(3) is disposed between the filter electrode 30(3) and the second end 212 in the first direction of the piezoelectric substrate 20. The input terminal electrode 40(3) is disposed between the first end 221 and the filter electrode 30(3) in the second direction of the piezoelectric substrate 20. A portion of the input terminal electrode 40(3) may overlap an area in which the filter electrode 30(3) is provided in the first direction or the second direction. The input terminal electrode 40(3) corresponds to a "first terminal electrode for the filter electrode at the second end".

The input terminal electrode 40(3) is connected to the filter electrode 30(3) by a wiring electrode provided on the surface of the piezoelectric substrate 20. It is preferable that the wiring electrode be as short as possible.

The output terminal electrode 50(1) is disposed between the first end 211 and the filter electrode 30(1) in the first direction of the piezoelectric substrate 20. The output terminal electrode 50(1) is disposed between the second end 222 and the filter electrode 30(1) in the second direction of the piezoelectric substrate 20. In other words, the output terminal electrode 50(1) is disposed on the opposite side to the input terminal electrode 40(1) with respect to the filter electrode 30(1). A part of the output terminal electrode 50(1) may overlap an area in which the filter electrode 30(1) is provided in the first direction or the second direction. The output terminal electrode 50(1) corresponds to a "second terminal electrode for the filter electrode at the first end".

The output terminal electrode 50(1) is connected to the filter electrode 30(1) by a wiring electrode provided on the surface of the piezoelectric substrate 20. It is preferable that the wiring electrode be as short as possible.

The output terminal electrode 50(2) is disposed between the filter electrode 30(2) and the filter electrode 30(3) in the first direction of the piezoelectric substrate 20. The output terminal electrode 50(2) is disposed among the second end 222, the filter electrode 30(2), and the filter electrode 30(3) in the second direction of the piezoelectric substrate 20. In other words, the output terminal electrode 50(2) is disposed on the opposite side to the input terminal electrode 40(2) with respect to the filter electrode 30(2). A portion of the output terminal electrode 50(2) may overlap areas in which the filter electrode 30(2) and the filter electrode 30(3) are provided in the first direction or the second direction. The output terminal electrode 50(2) corresponds to a "second terminal electrode for the third filter electrode".

The output terminal electrode 50(2) is connected to the filter electrode 30(2) by a wiring electrode provided on the surface of the piezoelectric substrate 20. It is preferable that the wiring electrode be as short as possible.

The output terminal electrode 50(3) is disposed between the filter electrode 30(3) and the second end 212 in the first direction of the piezoelectric substrate 20. The output terminal electrode 50(3) is disposed between the second end 222 and the filter electrode 30(3) in the second direction of the piezoelectric substrate 20. In other words, the output terminal electrode 50(3) is disposed on the opposite side to the input terminal electrode 40(3) with respect to the filter electrode 30(3). A portion of the output terminal electrode 50(3) may overlap an area in which the filter electrode 30(3) is provided in the first direction or the second direction. The output terminal electrode 50(3) corresponds to a "second terminal electrode for the filter electrode at the second end".

The output terminal electrode 50(3) is connected to the filter electrode 30(3) by a wiring electrode provided on the surface of the piezoelectric substrate 20. It is preferable that the wiring electrode be as short as possible.

The plurality of ground terminal electrodes 60(12) and 60(23) are preferably pad-shaped electrodes, for example. Although these electrodes are illustrated as circular when viewed in plan in FIG. 1, they may be rectangular, polygonal, or other suitable shapes.

The ground terminal electrode 60(12) is disposed between the filter electrode 30(1) and the filter electrode 30(2) in the first direction of the piezoelectric substrate 20. The ground terminal electrode 60(12) is disposed among the second end 222, the filter electrode 30(1), and the filter electrode 30(2) in the second direction of the piezoelectric substrate 20. The ground terminal electrode 60(12) is disposed at the same or substantially the same position as the input terminal electrode 40(2) in the first direction, and is disposed at the same or substantially the same position as the output terminal electrode 50(2) in the second direction. A portion of the ground terminal electrode 60(12) may overlap areas in which the filter electrode 30(1) and the filter electrode 30(2) are provided in the first direction or the second direction. The ground terminal electrode 60(12) corresponds to a "ground terminal electrode for the third filter electrode".

The ground terminal electrode 60(12) is connected to the filter electrode 30(1) and the filter electrode 30(2) by wiring electrodes provided on the surface of the piezoelectric substrate 20. It is preferable that the wiring electrodes be as short as possible. In this manner, the ground terminal electrode 60(12) is an electrode common to the two, that is, the filter electrode 30(1) and the filter electrode 30(2), which are adjacent to the ground terminal electrode 60(12).

The ground terminal electrode 60(23) is disposed between the filter electrode 30(2) and the filter electrode 30(3) in the first direction of the piezoelectric substrate 20. The ground terminal electrode 60(23) is disposed among the first end 221, the filter electrode 30(2), and the filter electrode 30(3) in the second direction of the piezoelectric substrate 20. The ground terminal electrode 60(23) is disposed at the same or substantially the same position as the output terminal electrode 50(2) in the first direction, and is disposed at the same or substantially the same position as the input terminal electrode 40(2) in the second direction. A portion of the ground terminal electrode 60(23) may overlap areas in which the filter electrode 30(2) and the filter electrode 30(3) are provided in the first direction or the second direction. The ground terminal electrode 60(23) corresponds to a "ground terminal electrode for the third filter electrode".

The ground terminal electrode 60(23) is connected to the filter electrode 30(2) and the filter electrode 30(3) by wiring electrodes provided on the surface of the piezoelectric substrate 20. It is preferable that the wiring electrodes be as short as possible. In this manner, the ground terminal electrode 60(23) is an electrode common to the two, that is, the filter electrode 30(2) and the filter electrode 30(3), which are adjacent to the ground terminal electrode 60(23). Because the filter electrode 30(2) is connected to the ground terminal electrode 60(12), the filter electrode 30(2) need not be connected to the ground terminal electrode 60(23). In contrast, the filter electrode 30(2) and the ground terminal electrode 60(12) need not be connected to each other if the filter electrode 30(2) and the ground terminal electrode 60(23) are connected to each other.

With such a configuration, the elastic wave device 10 may preferably have a circuit configuration illustrated in FIG. 2. The elastic wave device 10 includes an elastic wave filter 70(1), an elastic wave filter 70(2), and an elastic wave filter 70(3). The elastic wave filter 70(1) is defined by the filter electrode 30(1) and the piezoelectric substrate 20. The elastic wave filter 70(2) is defined by the filter electrode 30(2) and the piezoelectric substrate 20. The elastic wave filter 70(3) is defined by the filter electrode 30(3) and the piezoelectric substrate 20.

The input terminal electrode 40(1), the output terminal electrode 50(1), and the ground terminal electrode 60(12) are connected to the elastic wave filter 70(1). The input terminal electrode 40(2), the output terminal electrode 50(2), and the ground terminal electrodes 60(12) and 60(23) are connected to the elastic wave filter 70(2). The input terminal electrode 40(3), the output terminal electrode 50(3), and the ground terminal electrode 60(23) are connected to the elastic wave filter 70(3). The ground terminal electrodes 60(12) and 60(23) are connected to a ground potential.

With the above-described configuration, the ground terminal electrode 60(12) is disposed at a position adjacent to the elastic wave filter 70(1) (filter electrode 30(1)) and the elastic wave filter 70(2) (filter electrode 30(2)) without another filter electrode interposed therebetween. The ground terminal electrode 60(23) is disposed at a position adjacent to the elastic wave filter 70(2) (filter electrode 30(2)) and the elastic wave filter 70(3) (filter electrode 30(3)) without another filter electrode interposed therebetween.

Accordingly, the distance between each of the elastic wave filters 70(1), 70(2), and 70(3) and the ground potential is shortened. The ground of the elastic wave filters 70(1), 70(2), and 70(3) becomes stable, and the elastic wave filters 70(1), 70(2), and 70(3) have good filter characteristics.

In addition, the number of the ground terminal electrodes 60(12) and 60(23) (two in the present preferred embodiment) is less than the number of the filter electrodes 30(1), 30(2), and 30(3) (for example, three in the present preferred embodiment). Therefore, the area required for a plurality of ground terminal electrodes is reduced as compared to the case of individually providing a plurality of ground terminals for a plurality of filter electrodes. Accordingly, the size of the elastic wave device 10 is reduced.

In this manner, by using the configuration of the present preferred embodiment, the elastic wave device 10 achieves good filter characteristics for each of a plurality of elastic wave filters and is reduced in size.

Figure 3A:
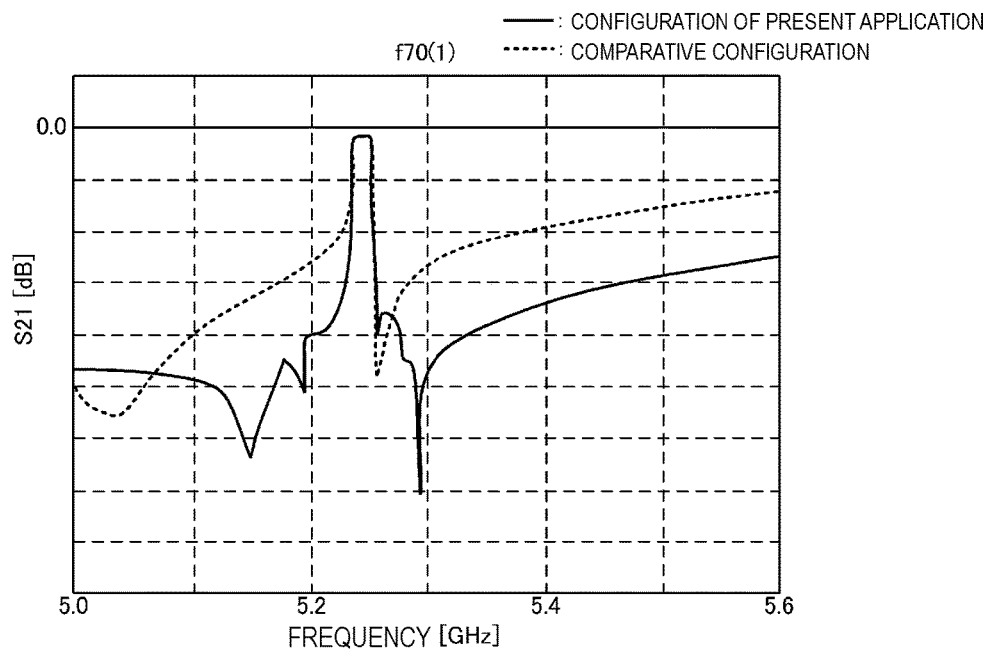
FIG. 3A illustrates the bandpass characteristics of an elastic wave filter on a first end side of a piezoelectric substrate.
Figure 3B:
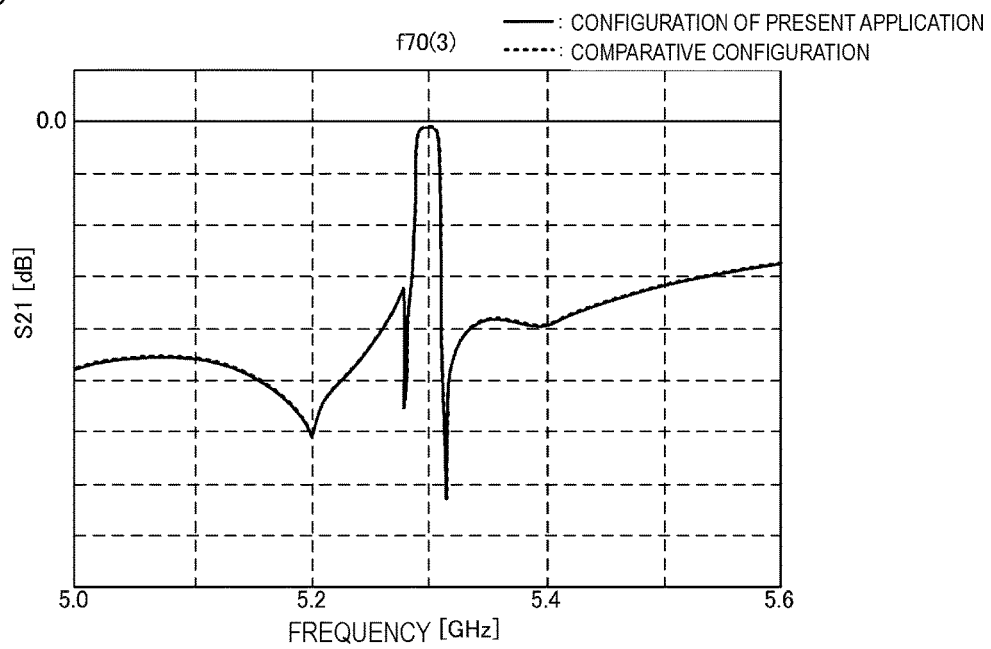
FIG. 3B illustrates the bandpass characteristics of the elastic wave filter on a second end side.

FIGS. 3A and 3B include diagrams of the bandpass characteristics of an elastic wave filter of an elastic wave device according to a first preferred embodiment of the present invention. FIG. 3A illustrates the bandpass characteristics of the elastic wave filter on a first end side of the piezoelectric substrate, and FIG. 3B illustrates the bandpass characteristics of the elastic wave filter on a second end side of the piezoelectric substrate. In FIGS. 3A and 3B, a solid line represents the bandpass characteristics of the configuration of an example of a preferred embodiment of the present application, and a broken line represents the bandpass characteristics of a comparative example. The comparative example has the configuration illustrated in FIG. 4.

Figure 4:
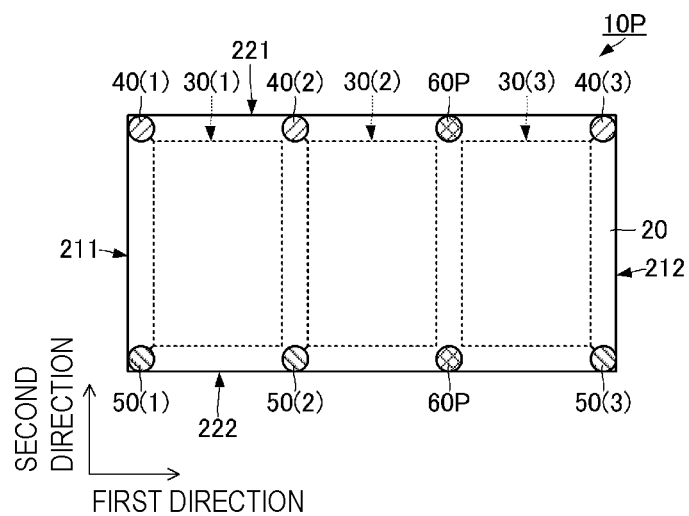
FIG. 4 is a plan view schematically illustrating the configuration of an elastic wave device according to a comparative example.

FIG. 4 is a plan view schematically illustrating the configuration of an elastic wave device of a comparative example. An elastic wave device 10P of the comparative example is different from the elastic wave device 10 of an example of a preferred embodiment of the present invention in the arrangement of the output terminal electrode 50(2) and a plurality of ground terminal electrodes 60P. The remaining configuration and arrangement of the elastic wave device 10P of the comparative example is the same or substantially the same as the elastic wave device 10 of an example of a preferred embodiment of the present invention.

The output terminal electrode 50(2) is disposed between the filter electrode 30(1) and the filter electrode 30(2) in the first direction. Two ground terminal electrodes 60P are disposed between the filter electrode 30(2) and the filter electrode 30(3) in the first direction. One ground terminal electrode 60P is disposed among the first end 221, the filter electrode 30(2), and the filter electrode 30(3) in the second direction. The other ground terminal electrode 60P is disposed among the second end 222, the filter electrode 30(2), and the filter electrode 30(3) in the second direction. The plurality of ground terminal electrodes 60P are connected to any of the plurality of filter electrodes 30(1), 30(2), and 30(3). That is, the elastic wave device 10P of the comparative example is configured such that the distance between the filter electrode 30(1) (elastic wave filter 70(1)) and each ground terminal electrode 60P is relatively long.

As illustrated in FIG. 3A, the elastic wave filter 70(1) of the elastic wave device 10 of an example of a preferred embodiment of the present invention is configured such that, in comparison with the elastic wave filter 70(1) of the elastic wave device 10P of the comparative example, the attenuation characteristics on the higher frequency side and the lower frequency side of the passband are improved, while the loss (insertion loss) in the passband does not deteriorate. Specifically, in the case of FIG. 3A, the attenuation characteristics on the lower frequency side of the passband become steep, thus achieving great attenuation over a wideband on the higher frequency side of the passband.

In addition, as illustrated in FIG. 3B, the filter characteristics of the elastic wave filter 70(3) of the elastic wave device 10 of an example of a preferred embodiment of the present invention do not deteriorate, in comparison with the elastic wave filter 70(3) of the elastic wave device 10P of the comparative example. That is, there are two ground terminal electrodes 60P near the elastic wave filter 70(3) in the elastic wave device 10P of the comparative example, whereas there is only one ground terminal electrode 60(23) near the elastic wave filter 70(3) in the elastic wave device 10 of an example of a preferred embodiment of the present invention. However, the filter characteristics of the elastic wave filter 70(3) of the elastic wave device 10 of an example of a preferred embodiment of the present invention is able to achieve characteristics equivalent to the filter characteristics of the elastic wave filter 70(3) of the elastic wave device 10P of the comparative example.

In this manner, also from the simulation result, the elastic wave device 10 is able to achieve good filter characteristics for each of a plurality of elastic wave filters.

Note that, as illustrated in FIG. 1, the input terminal electrode 40(1) and the output terminal electrode 50(1) are close to the filter electrode 30(1) without another filter electrode interposed therebetween. Similarly, the input terminal electrode 40(2) and the output terminal electrode 50(2) are close to the filter electrode 30(2) without another filter electrode interposed therebetween. Similarly, the input terminal electrode 40(3) and the output terminal electrode 50(3) are close to the filter electrode 30(3) without another filter electrode interposed therebetween. Accordingly, the elastic wave filters 70(1), 70(2), and 70(3) are able to have even better filter characteristics.

In addition, it is preferable that the distance between the plurality of filter electrodes 30(1), 30(2), and 30(3), and the distance between these filter electrodes 30(1), 30(2), and 30(3) and the first end 211 and the second end 212 in the first direction and the first end 221 and the second end 222 in the second direction of the piezoelectric substrate 20 be as short as possible. For example, it is preferable that these distances be the approximate dimensions in the first direction and the second direction of pad-shaped electrodes respectively defining the above-described input terminal electrodes, output terminal electrodes, and ground terminal electrodes. Accordingly, the elastic wave device 10 is able to be even smaller.

Figure 5:
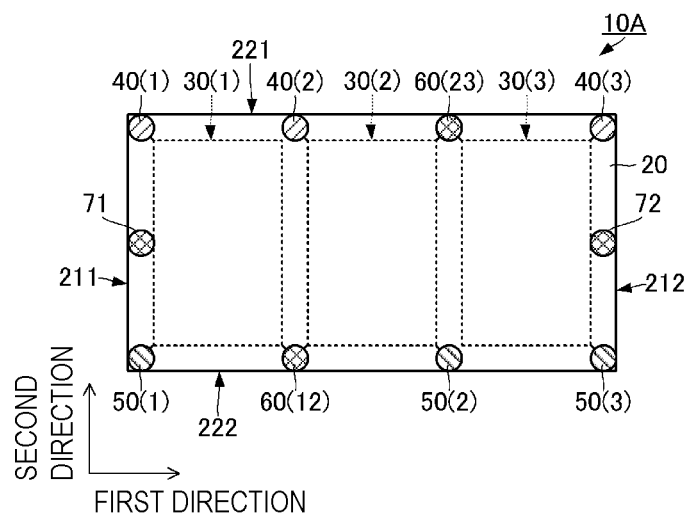
FIG. 5 is a plan view schematically illustrating the configuration of an elastic wave device according to a second preferred embodiment of the present invention.

Next, an elastic wave device according to a second preferred embodiment of the present invention will be described with reference to the drawings. FIG. 5 is a plan view schematically illustrating the configuration of the elastic wave device according to the second preferred embodiment of the present invention.

As illustrated in FIG. 5, an elastic wave device 10A according to the present preferred embodiment is different from the elastic wave device 10 according to the first preferred embodiment in that a plurality of auxiliary ground terminal electrodes 71 and 72 are included. The remaining configuration of the elastic wave device 10A is the same or substantially the same as the elastic wave device 10 according to the first preferred embodiment, and descriptions of the same portions are omitted.

The auxiliary ground terminal electrode 71 corresponds to a "first auxiliary ground terminal electrode", and the auxiliary ground terminal electrode 72 corresponds to a "second auxiliary ground terminal electrode". The plurality of auxiliary ground terminal electrodes 71 and 72 are preferably made of the same material as the ground terminal electrodes 60(12) and 60(23).

The auxiliary ground terminal electrode 71 is disposed between the first end 211 and the filter electrode 30(1) in the first direction of the piezoelectric substrate 20. In other words, the auxiliary ground terminal electrode 71 is disposed at the same or substantially the same position as the input terminal electrode 40(1) and the output terminal electrode 50(1) in the first direction of the piezoelectric substrate 20. The auxiliary ground terminal electrode 71 is disposed between the input terminal electrode 40(1) and the output terminal electrode 50(1) in the second direction of the piezoelectric substrate 20. The auxiliary ground terminal electrode 71 is connected to the filter electrode 30(1). Note that the auxiliary ground terminal electrode 71 may be connected to the filter electrode 30(2).

The auxiliary ground terminal electrode 72 is disposed between the second end 212 and the filter electrode 30(3) in the first direction of the piezoelectric substrate 20. In other words, the auxiliary ground terminal electrode 72 is disposed at the same or substantially the same position as the input terminal electrode 40(3) and the output terminal electrode 50(3) in the first direction of the piezoelectric substrate 20. The auxiliary ground terminal electrode 72 is disposed between the input terminal electrode 40(3) and the output terminal electrode 50(3) in the second direction of the piezoelectric substrate 20. The auxiliary ground terminal electrode 72 is connected to the filter electrode 30(3). Note that the auxiliary ground terminal electrode 72 may be connected to the filter electrode 30(2).

With such a configuration, the elastic wave device 10A is able to further improve the grounding of the filter electrode 30(1) (elastic wave filter 70(1)) and the filter electrode 30(3) (elastic wave filter 70(3)) even with the same planar area as the elastic wave device 10. Accordingly, the ground of the elastic wave filters 70(1) and 70(3) becomes more stable, and the elastic wave filters 70(1) and 70(3) have even better filter characteristics.

Note that at least one of the auxiliary ground terminal electrodes 71 and 72 may be omitted.

In addition, with such a configuration, because the auxiliary ground terminal electrode 71 is disposed between the input terminal electrode 40(1) and the output terminal electrode 50(1) in the elastic wave filter 70(1), isolation between the input terminal electrode 40(1) and the output terminal electrode 50(1) is able to be improved. Similarly, because the auxiliary ground terminal electrode 72 is disposed between the input terminal electrode 40(3) and the output terminal electrode 50(3) in the elastic wave filter 70(3), isolation between the input terminal electrode 40(3) and the output terminal electrode 50(3) is able to be improved.

Figure 6:
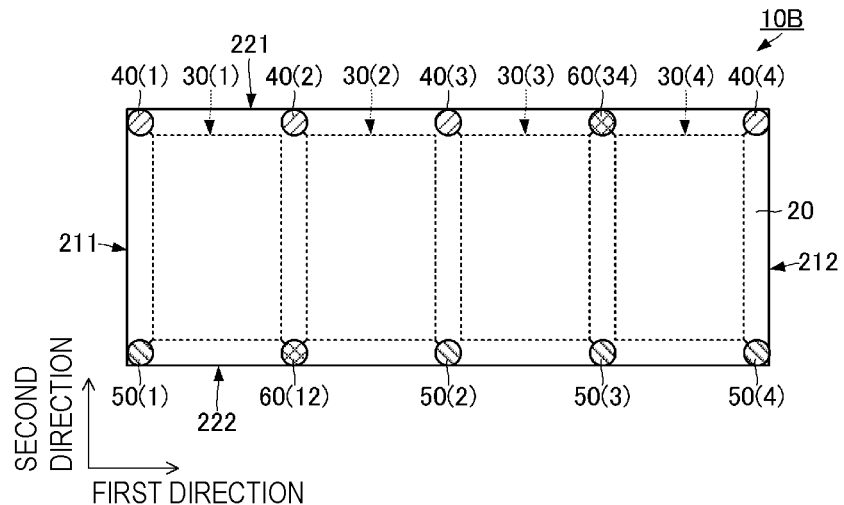
FIG. 6 is a plan view schematically illustrating the configuration of an elastic wave device according to a third preferred embodiment of the present invention.
Figure 7:
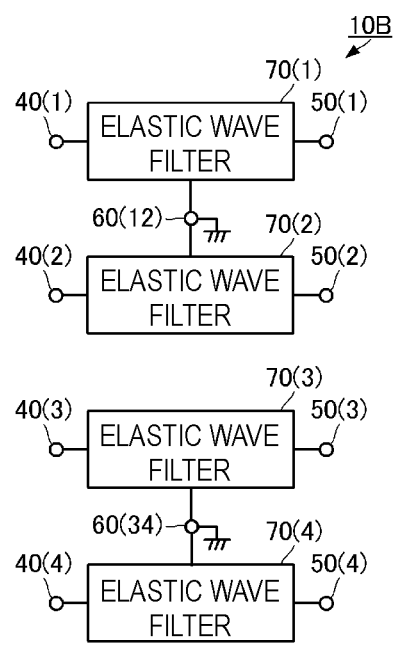
FIG. 7 is an equivalent circuit diagram of the elastic wave device according to the third preferred embodiment of the present invention.

Next, an elastic wave device according to a third preferred embodiment of the present invention will be described with reference to the drawings. FIG. 6 is a plan view schematically illustrating the configuration of the elastic wave device according to the third preferred embodiment of the present invention. FIG. 7 is an equivalent circuit diagram of the elastic wave device according to the third preferred embodiment of the present invention.

As illustrated in FIG. 6, an elastic wave device 10B according to the present preferred embodiment is different from the elastic wave device 10 according to the first preferred embodiment in that one filter electrode 30(4), one input terminal electrode 40(4), and one output terminal electrode 50(4) are included, and the arrangement of a plurality of ground terminal electrodes.

As illustrated in FIG. 6, the elastic wave device 10B includes a piezoelectric substrate 20, a plurality of filter electrodes 30(1), 30(2), 30(3), and 30(4), a plurality of input terminal electrodes 40(1), 40(2), 40(3), and 40(4), a plurality of output terminal electrodes 50(1), 50(2), 50(3), and 50(4), and a plurality of ground terminal electrodes 60(12) and 60(34).

The arrangement of the plurality of filter electrodes 30(1), 30(2), and 30(3), the positions of the input terminal electrodes 40(1) and 40(2) with respect to the plurality of filter electrodes 30(1) and 30(2), the positions of the plurality of output terminal electrodes 50(1) and 50(2), and the position of the ground terminal electrode 60(12) are the same or substantially the same as those in the elastic wave device 10, and descriptions of the same portions are omitted.

The filter electrode 30(4) is disposed on the opposite side to the filter electrode 30(2) with respect to the filter electrode 30(3) in the first direction. In addition, the filter electrode 30(4) is disposed at an end on the second end 212 side of the piezoelectric substrate 20.

The input terminal electrode 40(3) is disposed between the filter electrode 30(2) and the filter electrode 30(3) in the first direction of the piezoelectric substrate 20. The input terminal electrode 40(3) is disposed among the first end 221, the filter electrode 30(2), and the filter electrode 30(3) in the second direction of the piezoelectric substrate 20. The input terminal electrode 40(3) is connected to the filter electrode 30(3) by a wiring electrode provided on the surface of the piezoelectric substrate 20. It is preferable that the wiring electrode be as short as possible.

The input terminal electrode 40(4) is disposed between the filter electrode 30(4) and the second end 212 in the first direction of the piezoelectric substrate 20. The input terminal electrode 40(4) is disposed between the first end 221 and the filter electrode 30(4) in the second direction of the piezoelectric substrate 20. A portion of the input terminal electrode 40(3) may overlap an area in which the filter electrode 30(4) is provided in the first direction or the second direction. The input terminal electrode 40(4) corresponds to a "first terminal electrode for the filter electrode at the second end".

The input terminal electrode 40(4) is connected to the filter electrode 30(4) by a wiring electrode provided on the surface of the piezoelectric substrate 20. It is preferable that the wiring electrode be as short as possible.

The output terminal electrode 50(3) is disposed between the filter electrode 30(3) and the filter electrode 30(4) in the first direction of the piezoelectric substrate 20. The output terminal electrode 50(3) is disposed among the second end 222, the filter electrode 30(3), and the filter electrode 30(4) in the second direction of the piezoelectric substrate 20. The output terminal electrode 50(3) is connected to the filter electrode 30(3) by a wiring electrode provided on the surface of the piezoelectric substrate 20. It is preferable that the wiring electrode be as short as possible.

The output terminal electrode 50(4) is disposed between the filter electrode 30(4) and the second end 212 in the first direction of the piezoelectric substrate 20. The output terminal electrode 50(4) is disposed between the second end 222 and the filter electrode 30(4) in the second direction of the piezoelectric substrate 20. The output terminal electrode 50(4) corresponds to a "second terminal electrode for the filter electrode at the second end".

The output terminal electrode 50(4) is connected to the filter electrode 30(4) by a wiring electrode provided on the surface of the piezoelectric substrate 20. It is preferable that the wiring electrode be as short as possible.

The ground terminal electrode 60(34) is disposed between the filter electrode 30(3) and the filter electrode 30(4) in the first direction of the piezoelectric substrate 20. The ground terminal electrode 60(34) is disposed among the first end 221, the filter electrode 30(3), and the filter electrode 30(4) in the second direction of the piezoelectric substrate 20. The ground terminal electrode 60(34) is disposed at the same or substantially the same position as the output terminal electrode 50(3) in the first direction, and is disposed at the same or substantially the same position as the input terminal electrodes 40(3) and 40(4) in the second direction.

The ground terminal electrode 60(34) is connected to the filter electrode 30(3) and the filter electrode 30(4) by wiring electrodes provided on the surface of the piezoelectric substrate 20. It is preferable that the wiring electrodes be as short as possible. In this manner, the ground terminal electrode 60(34) is an electrode common to the two, that is, the filter electrode 30(3) and the filter electrode 30(4), which are adjacent to the ground terminal electrode 60(34).

With such a configuration, the elastic wave device 10B may have a circuit configuration illustrated in FIG. 7. The elastic wave device 10B includes an elastic wave filter 70(1), an elastic wave filter 70(2), an elastic wave filter 70(3), and an elastic wave filter 70(4). The elastic wave filter 70(1) is defined by the filter electrode 30(1) and the piezoelectric substrate 20. The elastic wave filter 70(2) is defined by the filter electrode 30(2) and the piezoelectric substrate 20. The elastic wave filter 70(3) is defined by the filter electrode 30(3) and the piezoelectric substrate 20. The elastic wave filter 70(4) is defined by the filter electrode 30(4) and the piezoelectric substrate 20.

The input terminal electrode 40(1), the output terminal electrode 50(1), and the ground terminal electrode 60(12) are connected to the elastic wave filter 70(1). The input terminal electrode 40(2), the output terminal electrode 50(2), and the ground terminal electrode 60(12) are connected to the elastic wave filter 70(2). The input terminal electrode 40(3), the output terminal electrode 50(3), and the ground terminal electrode 60(34) are connected to the elastic wave filter 70(3). The input terminal electrode 40(4), the output terminal electrode 50(4), and the ground terminal electrode 60(34) are connected to the elastic wave filter 70(4). The ground terminal electrodes 60 (12) and 60 (34) are connected to a ground potential.

With the above-described configuration, the ground terminal electrode 60(12) is disposed at a position adjacent to the elastic wave filter 70(1) (filter electrode 30(1)) and the elastic wave filter 70(2) (filter electrode 30(2)) without another filter electrode interposed therebetween. The ground terminal electrode 60(34) is disposed at a position adjacent to the elastic wave filter 70(3) (filter electrode 30(3)) and the elastic wave filter 70(4) (filter electrode 30(4)) without another filter electrode interposed therebetween.

Accordingly, the distance between each of the elastic wave filters 70(1), 70(2), 70(3), and 70(4) and the ground potential is shortened. The ground of the elastic wave filters 70(1), 70(2), 70(3), and 70(4) becomes stable, and the elastic wave filters 70(1), 70(2), 70(3), and 70(4) have good filter characteristics.

In addition, the number of the ground terminal electrodes 60(12) and 60(34) (two in the present preferred embodiment) is less than the number of the filter electrodes 30(1), 30(2), 30(3), and 30(4) (for example, four in the present preferred embodiment). Therefore, the area required for a plurality of ground terminals is smaller than that in the case of individually providing a plurality of ground terminals for a plurality of filter electrodes. Accordingly, the size of the elastic wave device 10B is reduced.

In this manner, by using the configuration of the present preferred embodiment, the elastic wave device 10B achieves good filter characteristics for each of a plurality of elastic wave filters and is reduced in size.

Note that the configuration according to the second preferred embodiment (configuration with the auxiliary ground terminal electrodes 71 and 72) may be applied to the configuration according to the present preferred embodiment (third preferred embodiment).

Although the number (n) of filter electrodes in the first direction of the piezoelectric substrate 20 is "3" or "4" in the above-described preferred embodiments, the number of filter electrodes that are provided may only need to be 3 or greater (an integer that satisfies n≥3). In this case, it is only necessary that the above-described configuration in which n=3 or 4 be applied as appropriate.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device comprising:
   a piezoelectric substrate; and
   an electrode pattern provided on a surface of the piezoelectric substrate and defining elastic wave filters; wherein
   the electrode pattern includes:
      n filter electrodes disposed along a first direction where n is an integer that satisfies n≥3;
      a first terminal electrode and a second terminal electrode corresponding to each of the n filter electrodes; and
      a ground terminal electrode corresponding to each of the n filter electrodes;
   the n filter electrodes include:
      a first filter electrode at a first end of the piezoelectric substrate in the first direction, a second filter electrode at a second end of the piezoelectric substrate in the first direction, and a third filter electrode different from the first and second filter electrodes;
      the ground terminal electrode corresponding to the third filter electrode is disposed between the third filter electrode and a filter electrode of the n filter electrodes adjacent to the third filter electrode; and
      no other filter electrode is disposed between the first filter electrode at the first end of the piezoelectric substrate and the ground terminal electrode connected thereto, between the second filter electrode at the second end of the piezoelectric substrate and the ground terminal electrode connected thereto, and between the third filter electrode and the ground terminal electrode connected thereto.

2. The elastic wave device according to claim 1, wherein the first terminal electrode corresponding to the third filter electrode is disposed on a first end side of the third filter electrode;
   the second terminal electrode corresponding to the third filter electrode is disposed on a second end side of the third filter electrode;
   the first terminal electrode and the second terminal electrode corresponding to the third filter electrode are disposed on opposite sides with respect to the third filter electrode in a second direction orthogonal or substantially orthogonal to the first direction; and
   the ground terminal electrode corresponding to the third filter electrode is disposed at a same or substantially same position as the second terminal electrode corresponding to the third filter electrode in the first direction, and a same or substantially same position as the first terminal electrode corresponding to the third filter electrode in the second direction, or a same or substantially same position as the first terminal electrode corresponding to the third filter electrode in the first direction, and a same or substantially same position as the second terminal electrode corresponding to the third filter electrode in the second direction.

3. The elastic wave device according to claim 1, wherein the first terminal electrode and the second terminal electrode corresponding to the first filter electrode are disposed along a second direction orthogonal or substantially orthogonal to the first direction between the first end of the piezoelectric substrate and the first filter electrode;
   the first terminal electrode and the second terminal electrode corresponding to the second filter electrode are disposed along the second direction between the second end of the piezoelectric substrate and the second filter electrode; and
   the ground terminal electrode corresponding to the first filter electrode and the ground terminal electrode corresponding to the second filter electrode are electrodes common to the ground terminal electrode corresponding to the third filter electrode adjacent respectively thereto.

4. The elastic wave device according to claim 1, further comprising a first auxiliary ground terminal electrode between the first filter electrode and the first end of the piezoelectric substrate.

5. The elastic wave device according to claim 4, wherein the first auxiliary ground electrode terminal is disposed at a same or substantially same position in the first direction as the first terminal electrode and the second terminal electrode corresponding to the first filter electrode.

6. The elastic wave device according to claim 4, wherein the first auxiliary ground electrode terminal is disposed between the first terminal electrode and the second terminal electrode corresponding to the first filter electrode in a second direction orthogonal or substantially orthogonal to the first direction.

7. The elastic wave device according to claim 1, further comprising a second auxiliary ground terminal electrode between the second filter electrode and the second end of the piezoelectric substrate.

8. The elastic wave device according to claim 7, wherein the second auxiliary ground electrode terminal is disposed between the first terminal electrode and the second terminal electrode corresponding to the second filter electrode in a second direction orthogonal or substantially orthogonal to the first direction.

9. The elastic wave device according to claim 7, wherein the second auxiliary ground electrode terminal is disposed at a same or substantially same position in the first direction as the first terminal electrode and the second terminal electrode corresponding to the second filter electrode.

10. The elastic wave device according to claim 1, wherein the first, second, and third filter electrodes have different filter characteristics from one another.

11. The elastic wave device according to claim 1, wherein the first terminal electrodes are input terminal electrodes.

12. The elastic wave device according to claim 1, wherein the second terminal electrodes are output terminal electrodes.

* * * * *